(12) United States Patent
Yang et al.

(10) Patent No.: US 11,798,959 B2
(45) Date of Patent: Oct. 24, 2023

(54) MANUFACTURING METHOD OF ARRAY SUBSTRATE

(71) Applicant: BOE TECHNOLOGY GROUP CO., LTD., Beijing (CN)

(72) Inventors: Wei Yang, Beijing (CN); Guangcai Yuan, Beijing (CN); Ce Ning, Beijing (CN); Xinhong Lu, Beijing (CN); Tianmin Zhou, Beijing (CN); Lizhong Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 620 days.

(21) Appl. No.: 16/965,495

(22) PCT Filed: Jul. 22, 2019

(86) PCT No.: PCT/CN2019/097131
§ 371 (c)(1),
(2) Date: Jul. 28, 2020

(87) PCT Pub. No.: WO2021/012158
PCT Pub. Date: Jan. 28, 2021

(65) Prior Publication Data
US 2023/0163145 A1    May 25, 2023

(51) Int. Cl.
*H01L 27/00*    (2006.01)
*H01L 27/12*    (2006.01)

(52) U.S. Cl.
CPC ...... *H01L 27/1288* (2013.01); *H01L 27/1248* (2013.01)

(58) Field of Classification Search
CPC ............ H01L 27/1288; H01L 27/1248; H01L 27/1251; H01L 27/1259; H01L 27/1225; H01L 27/12; H01L 27/124; H10K 59/00
See application file for complete search history.

(56) References Cited

U.S. PATENT DOCUMENTS

| | | | |
|---|---|---|---|
| 11,107,843 B2 * | 8/2021 | Qu | ........................ G02F 1/1368 |
| 2017/0271416 A1 | 9/2017 | Ryu | |
| 2021/0159254 A1 * | 5/2021 | Qu | ...................... H01L 27/1225 |

FOREIGN PATENT DOCUMENTS

| | | |
|---|---|---|
| CN | 104659036 A | 5/2015 |
| CN | 107507841 A | 12/2017 |
| CN | 107818991 A | 3/2018 |

* cited by examiner

*Primary Examiner* — Nikolay K Yushin
(74) *Attorney, Agent, or Firm* — Nath, Goldberg & Meyer; Joshua B. Goldberg (57) ABSTRACT

Provided are an array substrate and a manufacturing method thereof, the manufacturing method includes: forming a first active layer on a base substrate; forming a second active layer; forming a second gate on the second active layer; forming a first insulating layer covering the first active layer on the second gate; patterning the first insulating layer to form first via holes at both sides of the second gate to expose the second active layer; depositing a first metal layer in the first via holes and on the first insulating layer; patterning the first metal layer, removing a part of the first metal layer above the first active layer to expose the first insulating layer; etching the first insulating layer using the patterned first metal layer as a mask, forming second via holes above the first active layer to expose the first active layer; cleaning the exposed first active layer.

18 Claims, 6 Drawing Sheets

MANUFACTURING METHOD OF ARRAY SUBSTRATE

This is a National Phase Application filed under 35 U.S.C. 371 as a national stage of PCT/CN2019/097131, filed Jul. 22, 2019, the content of which is hereby incorporated by reference in its entirety.

TECHNICAL FIELD

The disclosure relates to the field of display technology, and particularly relates to an array substrate and a manufacturing method thereof.

BACKGROUND

With the development of display technology, full-screen bezel-less display products adopting bending (pad bonding) and double-SD (source-drain) technologies are more and more popular among users, and have a huge market prospect.

SUMMARY

An embodiment of the present disclosure provides a manufacturing method of an array substrate, including: providing a base substrate; forming a first active layer on a first surface of the base substrate; forming a second active layer; forming a second gate on a side of the second active layer away from the base substrate; forming a first insulating layer on a side of the second gate away from the base substrate, wherein the first insulating layer covers the first active layer; patterning the first insulating layer to form first via holes at both sides of the second gate to expose the second active layer; depositing a first metal layer in the first via holes and on a surface of the first insulating layer away from the base substrate; patterning the first metal layer, and removing at least a part of the first metal layer above the first active layer to expose the first insulating layer; etching the first insulating layer by using the patterned first metal layer as a mask, and forming second via holes above the first active layer to expose the first active layer; and cleaning the exposed first active layer.

In some implementations, the manufacturing method further includes: forming a first gate on a side of the first active layer away from the base substrate after forming the first active layer, and
    patterning the first metal layer, and removing at least a portion of the first metal layer above the first active layer further includes:
    patterning the first metal layer to remove two portions of the first metal layer above the first active layer, and etching the first insulating layer by using the patterned first metal layer as a mask, and forming the second via holes above the first active layer to expose the first active layer includes:
    etching the first insulating layer by using the patterned first metal layer as a mask, and forming the second via holes above the first active layer and on two sides of the first gate so as to expose the first active layer.

In some implementations, the manufacturing method further includes: after cleaning the exposed first active layer, depositing a second metal layer in the first via holes and on the surface of the first insulating layer away from the base substrate; and
    patterning the first metal layer and the second metal layer to remove portions of the first metal layer and the second metal layer above the first gate, and remove portions of the first metal layer and the second metal layer above the second gate to form a first source and a first drain coupled with the first active layer, a second source and a second drain coupled with the second active layer, and a connection wire between the first drain and the second source which are adjacent to each other.

In some implementations, patterning the first metal layer and the second metal layer to form the first source and the first drain coupled with the first active layer, and the second source and the second drain coupled with the second active layer further includes:
    removing portions of the first metal layer and the second metal layer above the first gate and the second gate; and
    removing portions of the first metal layer and the second metal layer between the first drain and the second source which are adjacent to each other.

In some implementations, the manufacturing method further includes: after patterning the first metal layer and the second metal layer to form the first source and the first drain coupled with the first active layer, and the second source and the second drain coupled with the second active layer, depositing a third metal layer on surfaces of the first source, the first drain, the second source, the second drain away from the base substrate and a surface of the second active layer between the first drain and the second source away from the base substrate.

In some implementations, forming the first active layer on the first surface of the base substrate includes:
    forming a first barrier layer on the first surface of the base substrate; forming a buffer layer on a first surface of the first barrier layer away from the base substrate; and
    forming the first active layer on a first surface of the buffer layer away from the base substrate.

In some implementations, forming the first gate on the side of the first active layer away from the base substrate includes:
    forming a first gate insulating layer on a first surface of the first active layer away from the base substrate; and
    forming the first gate on a first surface of the first gate insulating layer away from the base substrate.

In some implementations, forming the second active layer on the first surface of the base substrate includes:
    forming a second buffer layer on a first surface of the first gate away from the base substrate; and
    forming the second active layer on a first surface of the second buffer layer away from the base substrate.

In some implementations, forming the second gate on the side of the second active layer away from the base substrate includes:
    forming a second gate insulating layer on a first surface of the second active layer away from the base substrate; and
    forming the second gate on a first surface of the second gate insulating layer away from the base substrate.

In some implementations, cleaning the exposed first active layer includes: cleaning the exposed first active layer by using hydrofluoric acid.

In some implementations, a material of the first active layer includes low-temperature polysilicon and a material of the second active layer includes an oxide semiconductor.

An embodiment of the present disclosure provides an array substrate, including: a base substrate and a first thin film transistor and a second thin film transistor which are arranged on a first surface of the base substrate, wherein the first thin film transistor includes a first active layer, a first gate, a first source and a first drain, an insulating layer arranged between the first active layer and the first source and the first drain, the second thin film transistor includes a second active layer, a second gate, a second source and a second drain, and the insulating layer arranged between the second active layer and the second source and the second drain, and wherein the first source is located on a side of the first thin film transistor away from the second thin film transistor, and includes a first source portion, which includes a first body portion located in and protruding from the via hole in the insulating layer and a first extension portion extending from the first body portion in a direction away from the first drain, and a second source portion located between the first extension portion and the insulating layer and in contact with the first extension portion;

the first drain is located on a side of the first thin film transistor proximal to the second thin film transistor, and includes a first drain portion, which includes a second body portion located in and protruding from the via hole in the insulating layer and a second extension portion extending from the second body portion in a direction away from the first source, and a second drain portion located between the second extension portion and the insulating layer and in contact with the second extension portion;

the second source includes a third source portion and a fourth source portion, the third source portion is located in the via hole in the insulating layer and extends on a surface of the insulating layer in a direction away from the second drain, and the fourth source portion is located on a surface of the third source portion away from the base substrate and is electrically coupled with the third source portion;

the second drain includes a third drain portion and a fourth drain portion, the third drain portion is located in the via holes in the insulating layer and extends on the surface of the insulating layer along a direction away from the second source, and the fourth drain portion is located on a surface of the third drain portion away from the base substrate and is electrically coupled with the third drain portion; and the second source portion, the second drain portion, the third source portion and the third drain portion are made of a same material.

In some implementations, the array substrate further includes a fifth source portion, a fifth drain portion, a sixth source portion, a sixth drain portion, and a connection portion, the fifth source portion is located on a surface of the first source portion away from the base substrate, the fifth drain portion is located on a surface of the first drain portion away from the base substrate, the sixth source portion is located on a surface of the fifth source portion away from the base substrate, the sixth drain portion is located on a surface of the fourth drain portion away from the base substrate, the connection portion is located on the surface of the insulating layer away from the substrate and between the fifth drain portion and the seventh source portion, and is electrically coupled with the first drain portion, the second drain portion, the fifth drain portion, the third source portion, the fourth source portion and the sixth source portion, respectively.

DESCRIPTION OF DRAWINGS

The accompanying drawings, which are included to provide a further understanding of the disclosure and constitute a part of this specification, are used to explain the present disclosure together with the following embodiments, but do not constitute a limitation to the present disclosure. In the drawings.

DESCRIPTION OF EMBODIMENTS

In order to make those skilled in the art better understand the technical solutions of the present disclosure, an array substrate and a manufacturing method thereof provided by the present disclosure are further described in detail below with reference to the accompanying drawings and specific implementations.

In the related art, a low-temperature polysilicon (LTPS) semiconductor material and an Oxide semiconductor material are increasingly applied to a single display product. The LTPS semiconductor material has advantages of high mobility and fast charging speed, and the Oxide semiconductor material has an advantage of low leakage current. In the related art, the advantages of these two materials have been combined together in the field of display technology to manufacture an LTPO product, especially an LTPO OLED (LTPS & Oxide Organic Light Emitting Diode) display panel, so that users of the display product have greatly improved experiences.

However, preparation processes of the LTPS semiconductor material and the Oxide semiconductor material are greatly different, so that a problem of poor process compatibility exists, and it is difficult to guarantee a process stability. Furthermore, since the problem of poor process compatibility exists in the preparation processes of the LTPS semiconductor material and Oxide semiconductor material, and an additional process procedure is usually required to solve the problem of poor process compatibility, how to ensure, under a certain process procedure, characteristics and yield of LTPS and Oxide devices in an LTPO OLED full-screen becomes a problem.

For example, a basic manufacturing process of LTPO OLED in the related art includes Step 1 to Step 6.

Figure 1:
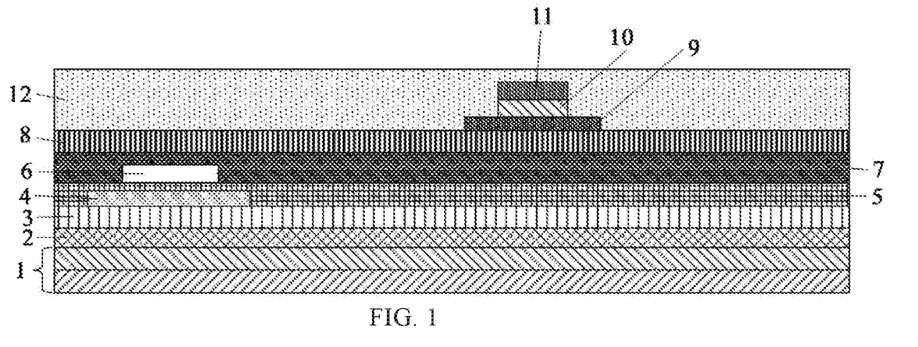
FIGS. 1 to 5 are schematic diagrams of structures of an array substrate at different manufacturing stages in the related art.

At Step 1, a base substrate 1 is provided, and a low-temperature polysilicon layer (first active layer 4), a first gate layer 6, an oxide semiconductor layer 2 (second active layer 2), and a second gate 11 are sequentially formed on the base substrate 1, and then an interlayer dielectric layer 12 is deposited, as shown in FIG. 1. A material of the base substrate may be any one selected from glass, polyimide (PI), plastic, silicon and the like.

Figure 2:
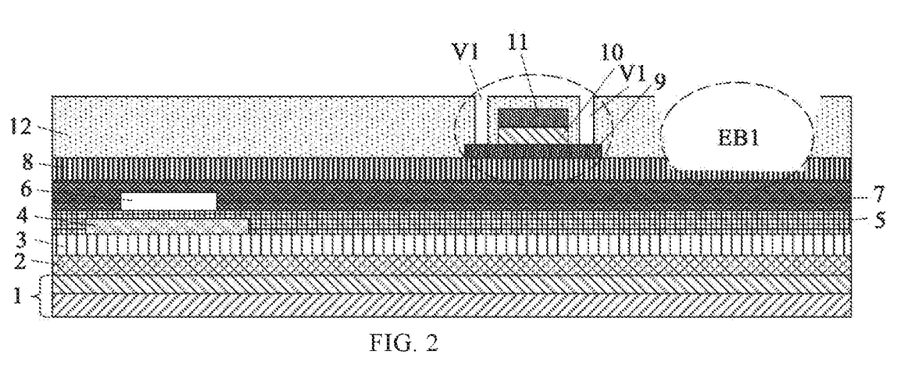

At Step 2, a mask etching process is performed on the base substrate subjected to Step 1, so that a via hole V1 and a first edge bending groove (EB1) are formed above the oxide semiconductor layer 2 in the interlayer dielectric layer 12, as shown in FIG. 2.

Figure 3:
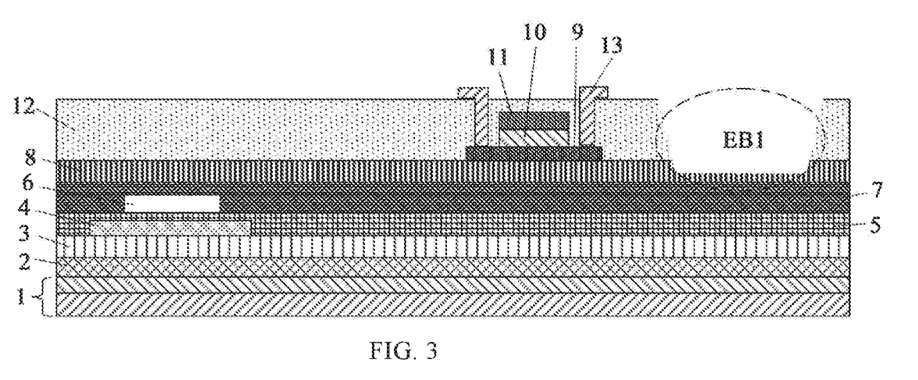

At Step 3, on the base substrate subjected to Step 2, a first metal layer 13 is deposited on the base substrate subjected to Step 2, and the first metal layer 13 is patterned by using a patterning process to form a drain and a source of an oxide semiconductor TFT, as shown in FIG. 3. In this way, a portion of the oxide semiconductor layer 2 exposed through the via hole can be protected by the first metal layer 13, so that the oxide semiconductor layer 2 is prevented from being affected by subsequent cleaning of the low-temperature polysilicon layer using hydrofluoric (HF) acid and a the formation of the via hole above the low-temperature polysilicon layer through etching, and a purpose of protecting the characteristics of an oxide thin film transistor (Oxide TFT) is achieved.

Figure 4:
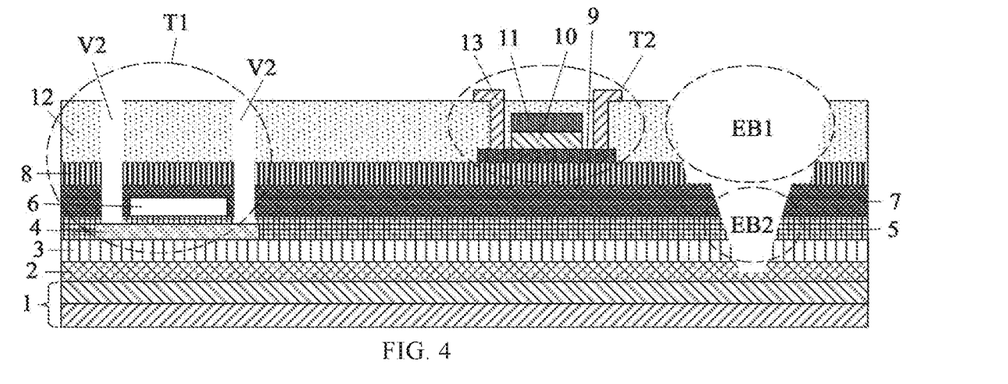

At Step 4, a mask etching process is performed on the base substrate subjected to Step 3, a via hole V2 is formed above the low-temperature polysilicon layer, and a second edge bending groove EB2 is formed simultaneously, as shown in FIG. 4, that is, the second edge bending groove EB2 is formed on a side of the first edge bending groove EB1 proximal to the base substrate. Each of the first edge bending groove EB1 and the second edge bending groove EB2 may be formed into a shape, a cross section of which is an inverted trapezoid. It can be understood that groove structures with different pore diameters and cross-sectional shapes can be obtained by controlling a time duration of etching and a concentration of etching solution. The second edge bending groove EB2 is formed by using a bottom of the first edge bending groove EB1 proximal to the base substrate as a mask, and the first edge bending groove EB1 and the second edge bending groove EB2 are finally communicated to form a stepped groove.

At Step 5, the low-temperature polysilicon layer is cleaned by using the hydrofluoric (HF) acid through the via hole V2.

Figure 5:
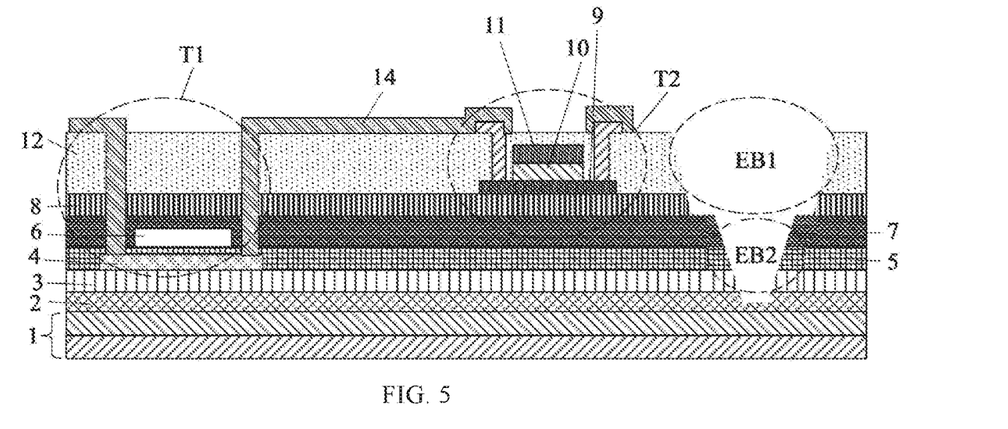

At Step 6, a second metal layer 14 is deposited on the base substrate subjected to Step 5, and a patterning process is performed on the second metal layer 14 to form a pattern, as a drain and a source of the LTPS TFT and a connection lead between the LTPS TFT (shown as T1 in the drawings) and the Oxide TFT (shown as T2 in the drawings), as shown in FIG. 5.

In the above examples, only main structures, for example, the glass substrate, the PI substrate, the low-temperature polysilicon layer, the first gate layer Gate1, the oxide semiconductor layer, the second gate 11, the second metal layer 14, etc., are described, certainly, as shown in FIGS. 1 to 5, the array substrate may further include a barrier layer 2, a buffer layer 3, a gate insulating layer 7, a second buffer layer 8, etc., which are not described in detail herein. In the above examples, the first edge bending groove EB1 is formed in the interlayer dielectric layer 12 and the second buffer layer 8, and the second edge bending groove EB2 is formed in the gate insulating layer 7, the first gate insulating layer 5, and the first buffer layer 3.

Figure 6:
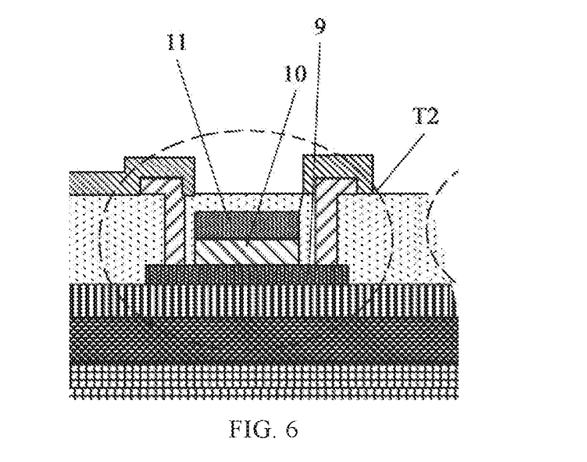
FIG. 6 is a schematic diagram showing a short circuit between a source/drain and a gate of an oxide TFT in the related art.

In the above-described examples, in order to ensure the characteristics of the Oxide TFT, the interlayer dielectric layer 12 is generally formed by an SiO thin film. In order to ensure a good ohmic contact between the low-temperature polysilicon layer and the second metal layer, before the patterned second metal layer is formed, the low-temperature polysilicon layer needs to be subjected to HF cleaning to remove oxide layer SiO on the surface of the low-temperature polysilicon layer. However, when the oxide layer SiO on the surface of the low-temperature polysilicon layer is removed by HF, the SiO film of the interlayer dielectric layer 12 is to be damaged, especially the SiO film of the interlayer dielectric layer 12 at a chamfer of the second gate 11 above the oxide semiconductor layer 9 is to be damaged, since the SiO film of the interlayer dielectric layer 12 at the chamfer of the second gate 11 is most fragile, the HF easily damages the SiO film here, and the HF may cause a short circuit between a second metal pattern formed in the future and the second gate 11, as shown in FIG. 6, thereby affecting the yield of LTPO products.

Figure 7:
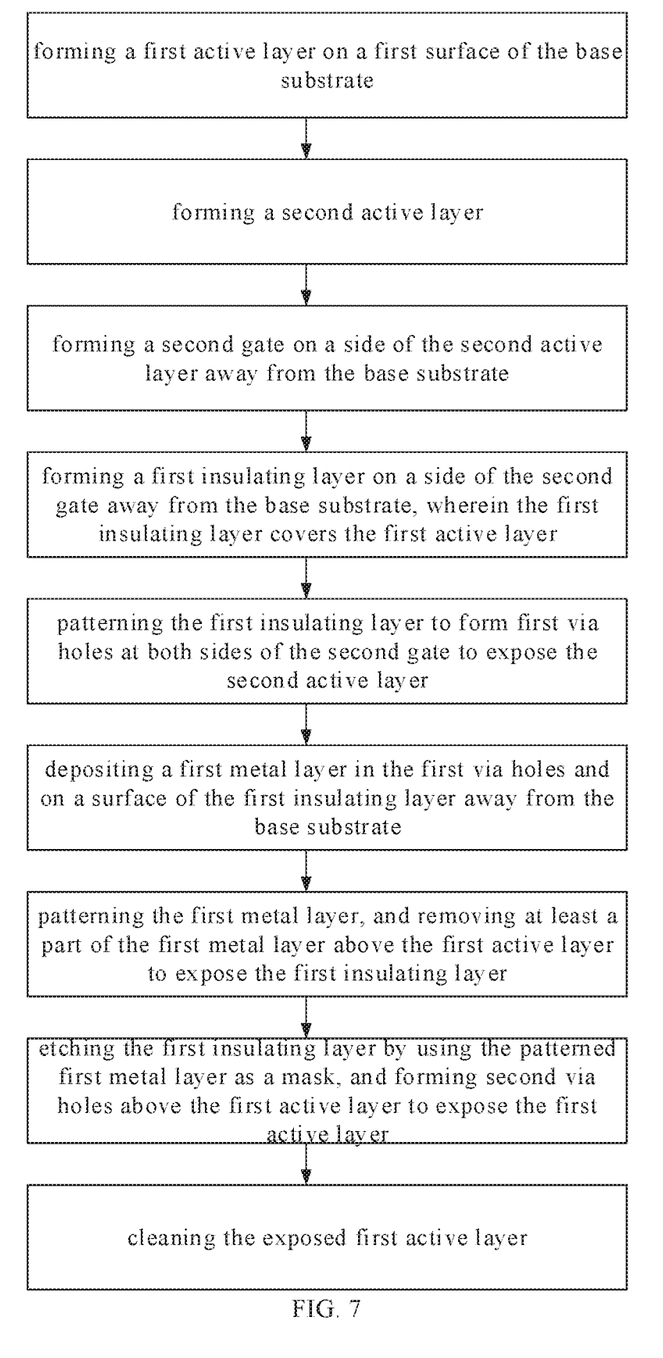
FIG. 7 is a flow chart of a method for manufacturing an array substrate according to an embodiment of the present disclosure.

In view of above, an embodiment of the present disclosure provides a manufacturing method of an array substrate, as shown in FIG. 7, the manufacturing method of an array substrate includes:

forming a first active layer on a first surface of a base substrate;

forming a second active layer on the first surface of the base substrate;

forming a second gate on a side of the second active layer away from the base substrate;

forming a first insulating layer on a side of the second gate away from the base substrate, wherein the first insulating layer covers the first active layer;

patterning the first insulating layer to form first via holes at both sides of the second gate to expose the second active layer;

depositing a first metal layer in the first via holes and on a surface of the first insulating layer away from the base substrate;

patterning the first metal layer, and removing at least a portion of the first metal layer above the first active layer to expose the first insulating layer;

etching the first insulating layer by using the patterned first metal layer as a mask, and forming second via holes above the first active layer to expose the first active layer; and cleaning the exposed first active layer.

In the present embodiment, when the first active layer is cleaned by using the hydrofluoric (HF) acid, the first metal layer has been already formed above the first insulating layer above the second gate, so that the hydrofluoric (HF) acid cannot damage the first insulating layer above the second gate, thereby avoiding a phenomenon of short circuit between a source or a drain to be formed and the second gate and improving the product yield. The method solves the problem of poor compatibility of LTPS and Oxide processes, reduces the number of masks and reduces the manufacturing cost.

In particular, FIGS. 8 to 15 are schematic diagrams of structures of an array substrate at different manufacturing stages according to an embodiment of the present disclosure. The manufacturing method of the array substrate includes Step 7 to Step 16.

Figure 8:
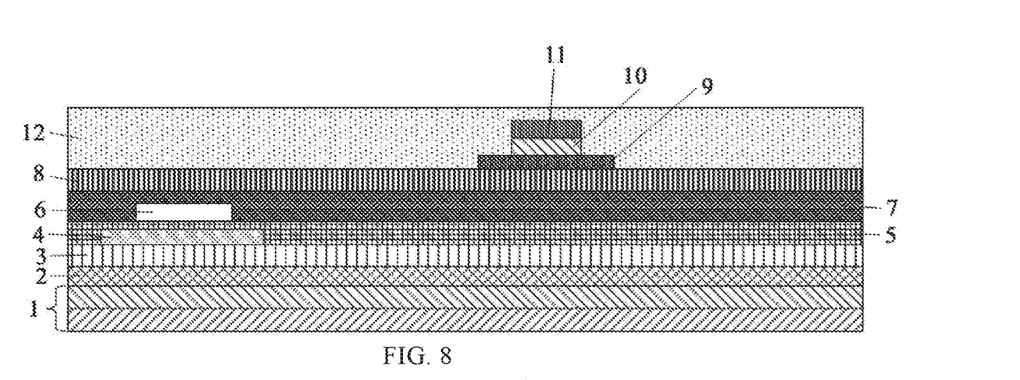
FIGS. 8 to 15 are schematic diagrams illustrating structures of an array substrate at different manufacturing stages according to an embodiment of the present disclosure.

At Step 7, a barrier layer 2, a first buffer layer 3, a low-temperature polysilicon layer (first active layer) 4, a first gate insulating layer 5, a first gate 6, a first interlayer insulating layer 7, a second buffer layer 8, an oxide semiconductor layer (second active layer) 9, a second gate insulating layer 10, a second gate 11, and a second interlayer dielectric layer 12 are sequentially formed on a base substrate 1 (e.g., a Glass substrate or a PI (polyimide) substrate) from bottom to top as shown in FIG. 8. An orthographic projection of the first gate 6 on the base substrate 1 falls within an orthographic projection of the low-temperature polysilicon layer 4 on the base substrate 1. An orthographic projection of the second gate 11 on the base substrate 1 falls within an orthographic projection of the oxide semiconductor layer 9 on the base substrate 1.

In the present embodiment, the oxide semiconductor layer may include any one of Indium Gallium Zinc Oxide (IGZO), Indium Zinc Oxide (IZO), zinc oxide (ZnO), and Gallium Zinc Oxide (GZO).

Figure 9:
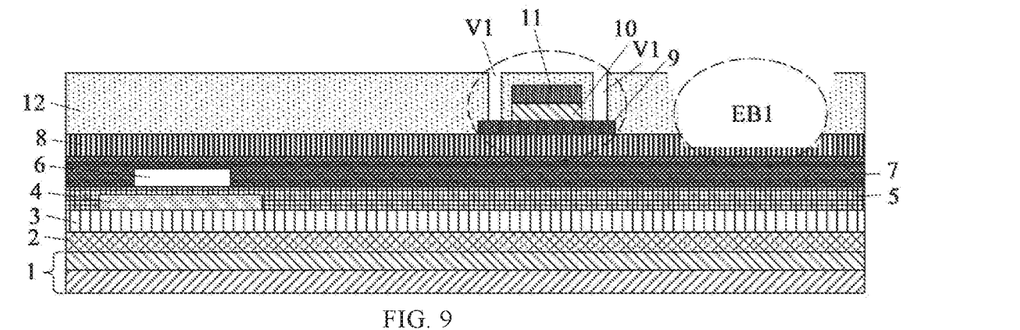

At Step 8, a mask etching process is performed on the base substrate subjected to Step 7, and via holes V1 located above the oxide semiconductor layer 9 and at two sides of the second gate 11 and an edge bending groove (EB 1) are formed in the interlayer dielectric layer 12, as shown in FIG. 9.

Figure 10:
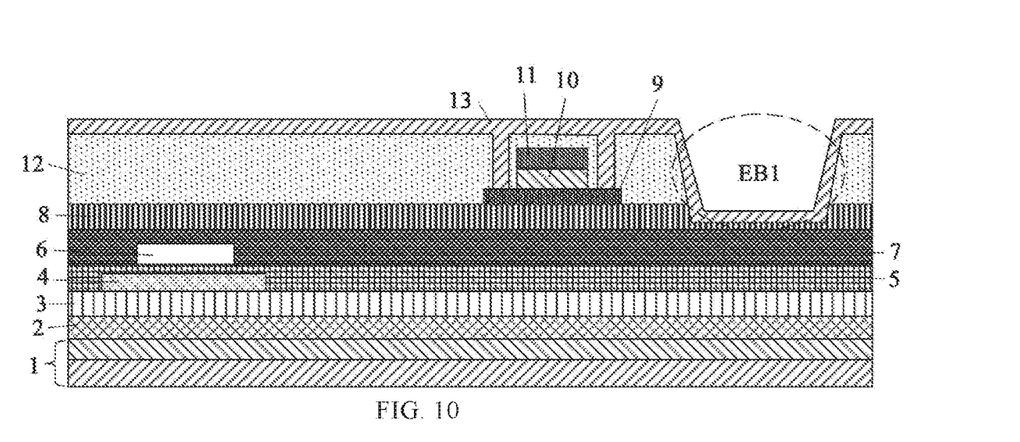
Figure 11:
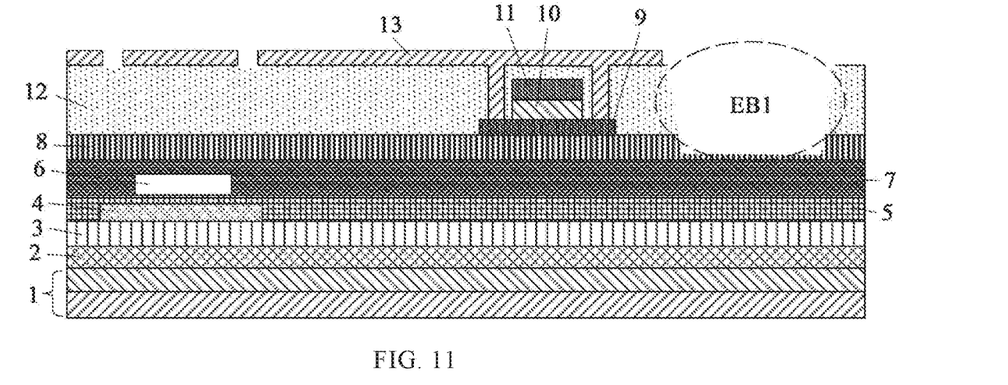

At Step 9, a first metal layer 13 is deposited on the base substrate subjected to Step 8, as shown in FIG. 10, the first metal layer 13 covers the entire surface of the base substrate. Meanwhile, a patterning process is performed on the first metal layer 13 to pattern the first metal layer 13, so that two portions of the first metal layer 13, which are located above the first active layer 4, are removed to expose the second interlayer dielectric layer 12, the two portions are located at two sides of the first gate 6, and a portion of the first metal layer 13 on a surface of the edge bending groove EB1 is removed at the same time. The first metal layer 13 deposited in the via holes V1 form the drain and source of the oxide semiconductor TFT, as shown in FIG. 11.

In this way, the second active layer exposed through the via holes can be protected by the first metal layer 13, so that the oxide semiconductor layer is prevented from being affected by the subsequent cleaning of the low-temperature polysilicon layer 4 by using hydrofluoric (HF) acid and the formation of the via holes above the low-temperature polysilicon layer 4 by etching, and the purpose of protecting the characteristics of the oxide thin film transistor (Oxide TFT) is achieved.

Figure 12:
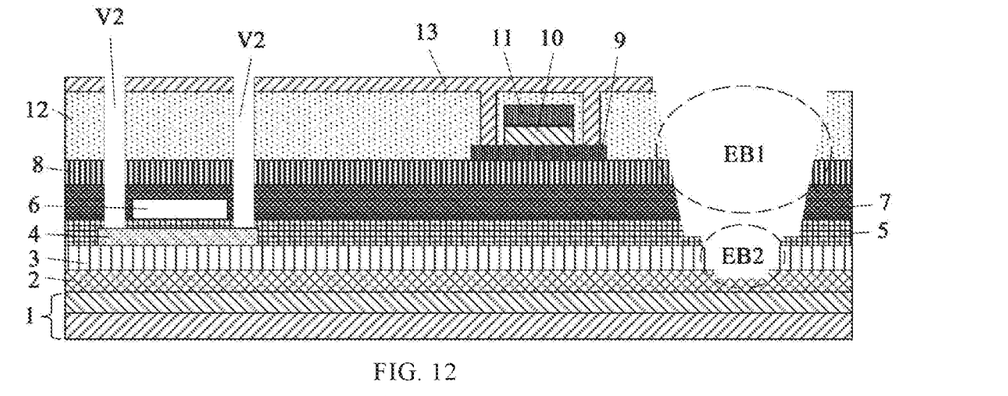

At Step 10, the second interlayer dielectric layer 12 is etched on the base substrate subjected to Step S9 by using the patterned first metal layer 13 as a mask, and second via holes V2 penetrating through the first gate insulating layer 5, the first interlayer insulating layer 7, the second buffer layer 8, and the second interlayer dielectric layer 12 are formed at the second interlayer dielectric layer exposed in the Step S9 and above the low-temperature polysilicon layer 4 to expose the first active layer 4, and an edge bending groove EB2 is formed simultaneously, as shown in FIG. 12.

In this step, the second via holes V2 are formed by using the patterned first metal layer as a mask, reducing the number of masks.

At Step 11, the low-temperature polysilicon layer 4 is cleaned by using the hydrofluoric (HF) acid through the via holes V2.

In the cleaning process, since the pattern of the first metal layer 13 covers the second interlayer dielectric layer 12 at this time, the second interlayer dielectric layer 12 is prevented from contacting the hydrofluoric (HF) acid, so that the second interlayer dielectric layer 12 cannot be damaged by the hydrofluoric (HF) acid, short circuit between the second gate 11 and the source or the drain (the first metal layer 13 formed in the first via holes V1) is avoided, and the yield of products is improved.

Figure 13:
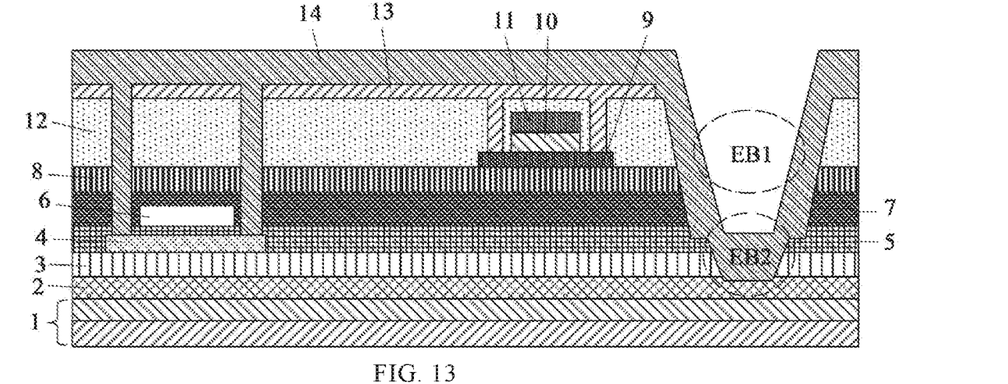
Figure 14:
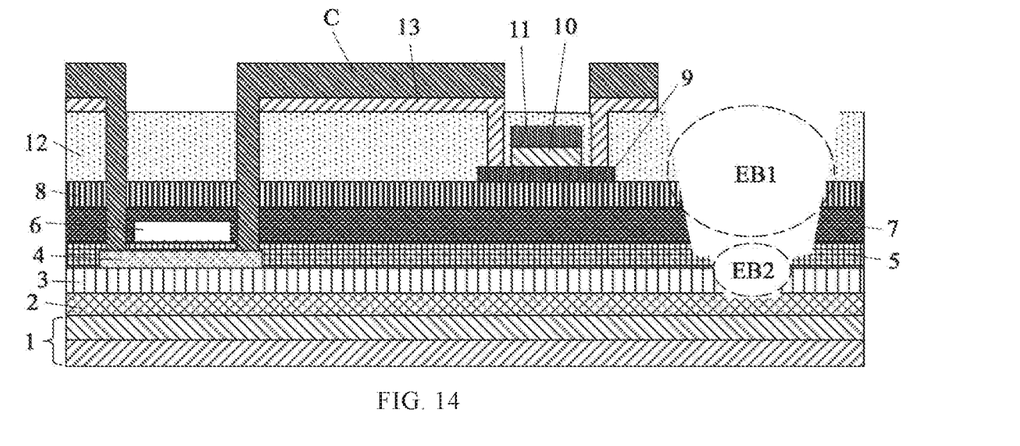

At Step 12, as shown in FIG. 13, a second metal layer 14 is deposited on the base substrate subjected to Step S11; and as shown in FIG. 14, a patterning process is performed on the second metal layer 14, portions of the first metal layer 13 and the second metal layer 14 above the first gate are removed, and portions of the first metal layer 13 and second metal layer 14 above the second gate 11 are removed, to form a first source S1 and a first drain D1 coupled to the first active layer (low-temperature polysilicon layer), a second source S2 and a second drain D2 coupled to the oxide semiconductor layer (second active layer) 9, and a connection wire C between the first drain D1 and the second source S2 which are adjacent to each other.

In this embodiment, the second metal layer 14 may be made of a metal material with a relatively low resistance, such as a multi-layer structure of Ti/Al/Ti (titanium/aluminum/titanium), and the first metal layer 13 is usually made of Mo (molybdenum) or Ti (titanium). In a case where the first metal layer 13 is made of Mo and the second metal layer 14 is made of the multi-layer structure of Ti/Al/Ti, when the first metal layer 13 and the second metal layer 14 are etched together to form a pattern, chlorine in etching gas may adhere to PR (photoresist) and sidewalls of the multi-layer structure of Ti/Al/Ti/Mo, the chlorine may contacts $H_2O$ in the air, resulting that Al may be severely corroded.

In some embodiments, after Step 11 is performed, that is, after the second via holes V2 are formed and cleaning is performed by using HF, the manufacturing method of the present embodiment may include Step 13 and Step 14.

Figure 15:
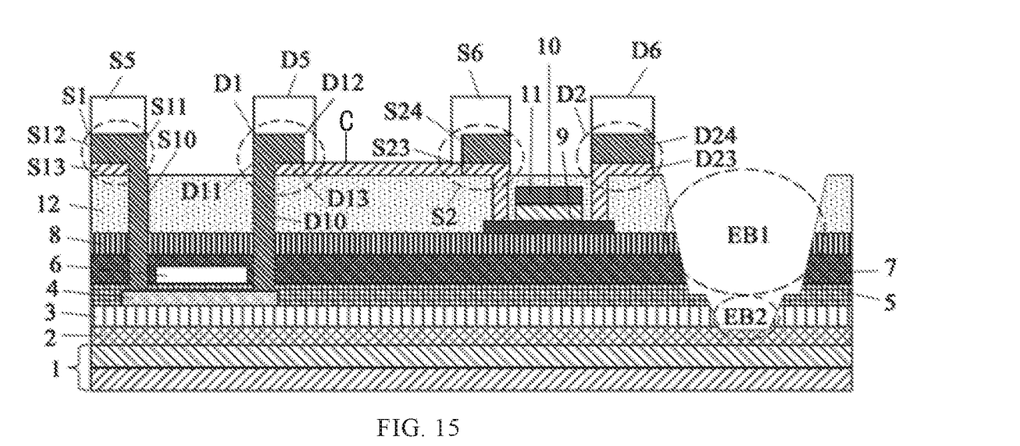

At Step 13, a second metal layer 14 is deposited on the base substrate, the second metal layer 14 may be made of Ti or Mo, and then the second metal layer 14 and the first metal layer 13 are patterned by a single patterning process, such that only portions of the second metal layer 14 and the first metal layer 13 in and around the via holes V1 and V2 are remained, and other portions of the first metal layer 13 and the second metal layer 14 are etched away, as shown in FIG. 15.

At Step 14, Ti, Al, Ti are deposited sequentially on the base substrate subjected to Step 13 to obtain a metal film layer of the multi-layer structure of Ti/Al/Ti, and a patterning process is performed on the metal film layer of the multi-layer structure of Ti/Al/Ti to form a metal pattern, as a drain and a source of the LTPS TFT and as a connection lead between the LTPS TFT (T1) and the Oxide TFT (T2), as shown in FIG. 15.

An embodiment of the present disclosure provides an array substrate, as shown in FIG. 15, the array substrate includes a base substrate 1 and a first thin film transistors T1 and a second thin film transistors T2 disposed on a first surface of the base substrate 1, the first thin film transistor Ti includes a first active layer 4, a first gate 6, a first source S1 and a first drain D1, an insulating layer 12 disposed between the first active layer 6 and the first source S1 and the first drain D1, the second thin film transistor T2 includes a second active layer 9, a second gate 11, a second source S2 and a second drain D2, the insulating layer 12 is also disposed between the second active layer 9 and the second source S2 and the second drain D2. The first source S1 and the first drain D1 are electrically coupled to the first active layer 4 through via holes, respectively. The second source S2 and the second drain D2 are electrically coupled to the second active layer 9 through via holes, respectively.

The first source S1 is located on a side of the first thin film transistor T1 away from the second thin film transistor T2, and includes a first source portion S11 and a second source portion S13, the first source portion S11 includes a first body portion S10 located in and protruding from the via hole in the insulating layer and a first extension portion S12 extending from the first body portion S10 in a direction away from the first drain and overlapping the second source portion S13, the second source portion S13 is located between the first extension portion S12 and the insulating layer 12 and is in contact with the insulating layer 12.

The first drain D1 is located on a side of the first thin film transistor T1 proximal to the second thin film transistor T2, and includes a first drain portion D11 and a second drain portion D13, the first drain portion D11 includes a second body portion D10 located in and protruding from the via hole in the insulating layer 12 and a second extension portion D12 extending from the second body portion D10 in a direction away from the first source and overlapping the second drain portion D13, the second drain portion D13 is located between the second extension portion D12 and the insulating layer 12 and is in contact with the insulating layer 12.

The second source S2 includes a third source portion S23 and a fourth source portion S24, the third source portion S23 is located in the via hole in the insulating layer 12 and extends on the surface of the insulating layer 12 in a direction away from the second drain D2, the fourth source portion S24 is located on a surface of the third source portion S23 away from the base substrate 1 and is electrically coupled to the third source portion S23.

The second drain D2 includes a third drain portion D23 and a fourth drain portion D24, the third drain portion D23 being disposed in the via hole in the insulating layer 12 and extending on a surface of the insulating layer 12 in a direction away from the second source S2, the fourth drain portion D24 is located on a surface of the third drain portion D23 away from the base substrate 1 and is electrically coupled to the third drain portion D23.

The second source portion S13, the second drain portion D13, the third source portion S23 and the third drain portion D23 are made of the same material, and may be formed from a single metal film layer through a single patterning process.

In this embodiment, the array substrate further includes a fifth source portion S5, a fifth drain portion D5, a sixth source portion S6, a sixth drain portion D6, and a connection portion C. The connection portion C is made of the same material as the second source portion S13, the second drain portion D13, the third source portion S23 and the third drain portion D23, and may be formed from a same metal layer as the second source portion S13, the second drain portion D13, the third source portion S23 and the third drain portion D23 by a single patterning process. The fifth source portion S5, the fifth drain portion D5, the sixth source portion S6, and the sixth drain portion D6 are made of the same material, and may be formed from a same metal film layer through a single patterning process.

In some implementations, after the first source S1, the first drain D1, the second source S2 and the second drain D2 are manufactured, the first drain D1 of the transistor T1 is not coupled with the second source S2 of the transistor T2, it is necessary to manufacture and pattern a conductive layer on a side of the first source S1, the first drain D1, the second source S2 and the second drain D2 away from the base substrate 1, so as to form the fifth source portion S5, the fifth drain portion D5, the sixth source portion S6, the sixth drain portion D6 and the connection portion C, where the connection portion C couples the first drain D1 with the second source S2.

Specifically, the fifth source portion S5 is disposed on a surface of the first source portion S1 away from the base substrate 1, the fifth drain portion D5 is disposed on a surface of the first drain portion D11 away from the base substrate 1, the sixth source portion S6 is disposed on a surface of the fourth source portion S24 away from the base substrate 1, the sixth drain portion S6 is disposed on a surface of the fourth drain portion D24 away from the base substrate 1, and the connection portion C is disposed on a surface of the insulating layer 12 away from the base substrate 1 and between the fifth drain portion D5 and the sixth source portion S6 and is electrically coupled to the first drain portion D11, the second drain portion D13, the fifth drain portion D5, the third source portion D23, the fourth source portion S24 and the sixth source portion S6, respectively.

In this embodiment, the second source portion S13, the second drain portion D13, the third drain portion D23 and the third source portion S23 all include molybdenum (Mo) or titanium (Ti), the first source portion S11, the first drain portion D11, the fourth source portion S24 and the fourth drain portion D24 all include molybdenum (Mo) or titanium (Ti), and the fifth source portion S5, the fifth drain portion D5, the sixth source portion S6 and the sixth drain portion D6 all include a multi-layer structure of titanium/aluminum/titanium (Ti/Al/Ti).

In the embodiment of the present disclosure, a large area of metal of the first metal layer is reserved, for example, the first metal layer is formed into the second source portion S13, the second drain portion D13, the third source portion S23 and the third drain portion D23, so that the exposed oxide semiconductor layer (the second active layer) can be protected from being affected by HF cleaning and etching the via holes (V2) to expose a portion surface of the low-temperature polysilicon layer, avoiding affecting the characteristics of the Oxide TFT. In addition, with the first metal layer, the interlayer dielectric layer is protected, so that the damage to the interlayer dielectric layer caused by HF cleaning is avoided, the short circuit between the second gate and the source or the drain of the Oxide TFT caused by the damaged interlayer dielectric layer is eliminated, and the yield of LTPO products is effectively improved.

In addition, in the technical solution of the present disclosure, after the pattern of the first metal layer is formed, the second via holes and the edge bending groove EB2 may formed through etching by using the patterned first metal layer as a mask, so that the number of masks is reduced.

In the embodiment of the present disclosure, although the first source S1 and the first drain D1, and the second source S2 and the second drain D2 are taken as an example for explanation, the present disclosure is not limited thereto. In some implementations, the first source S1 and the first drain D1 may not be distinguished, i.e., the first source S1 and the first drain D1 may be interchanged. In addition, the second source S2 and the second drain D2 may not be distinguished, that is, the second source S2 and the second drain D2 may be interchanged. The technical solutions in the above embodiments can be realized no matter how the first source S1 and the first drain D1 and the second source S2 and the second drain D2 are arranged.

It will be understood that the above embodiments are merely exemplary embodiments employed to illustrate the principles of the present disclosure, and the present disclosure is not limited thereto. It will be apparent to those skilled in the art that various changes and modifications can be made without departing from the spirit and scope of the disclosure, and these changes and modifications are considered within the scope of the disclosure.

What is claimed is:

1. A manufacturing method of an array substrate, comprising:
   providing a base substrate;
   forming a first active layer on a first surface of the base substrate;
   forming a second active layer on the first surface of the base substrate;
   forming a second gate on a side of the second active layer away from the base substrate;

forming a first insulating layer on a side of the second gate away from the base substrate, wherein the first insulating layer covers the first active layer;
patterning the first insulating layer to form first via holes at both sides of the second gate to expose the second active layer;
depositing a first metal layer in the first via holes and on a surface of the first insulating layer away from the base substrate;
patterning the first metal layer, and removing at least a part of the first metal layer above the first active layer to expose the first insulating layer;
etching the first insulating layer by using the patterned first metal layer as a mask, and forming second via holes above the first active layer to expose the first active layer; and
cleaning the exposed first active layer.

2. The manufacturing method of claim 1, wherein forming the second active layer on the first surface of the base substrate comprises:
forming a second buffer layer on a first surface of the first gate away from the base substrate; and
forming the second active layer on a first surface of the second buffer layer away from the base substrate.

3. The manufacturing method of claim 1, wherein forming the second gate on the side of the second active layer away from the base substrate comprises:
forming a second gate insulating layer on a first surface of the second active layer away from the base substrate; and
forming the second gate on a first surface of the second gate insulating layer away from the base substrate.

4. The manufacturing method of claim 1, wherein cleaning the exposed first active layer comprises:
cleaning the exposed first active layer by using hydrofluoric acid.

5. The manufacturing method of claim 1, wherein a material of the first active layer comprises low-temperature polysilicon and a material of the second active layer comprises an oxide semiconductor.

6. The manufacturing method of claim 1, further comprising:
after forming the first active layer, forming a first gate on a side of the first active layer away from the base substrate, wherein
patterning the first metal layer, and removing at least a portion of the first metal layer above the first active layer further comprises:
patterning the first metal layer to remove two portions of the first metal layer above the first active layer, and
etching the first insulating layer by using the patterned first metal layer as a mask, and forming second via holes above the first active layer to expose the first active layer comprises:
etching the first insulating layer by using the patterned first metal layer as a mask, and forming the second via holes above the first active layer and on two sides of the first gate so as to expose the first active layer.

7. The manufacturing method of claim 6, wherein forming the first gate on the side of the first active layer away from the base substrate comprises:
forming a first gate insulating layer on a first surface of the first active layer away from the base substrate; and
forming the first gate on a first surface of the gate insulating layer away from the base substrate.

8. The manufacturing method of claim 1, further comprising:

after cleaning the exposed first active layer, depositing a second metal layer in the first via holes and on a surface of the first insulating layer away from the base substrate; and
patterning the first metal layer and the second metal layer to remove portions of the first metal layer and the second metal layer above the first gate, and remove portions of the first metal layer and the second metal layer above the second gate to form a first source and a first drain coupled with the first active layer, a second source and a second drain coupled with the second active layer, and a connection wire between the first drain and the second source which are adjacent to each other.

9. The manufacturing method of claim 8, wherein patterning the first metal layer and the second metal layer to form the first source and the first drain coupled with the first active layer, and the second source and the second drain coupled with the second active layer comprises:
removing portions of the first metal layer and the second metal layer above the first gate and the second gate; and
removing portions of the first metal layer and the second metal layer between the first drain and the second source.

10. The manufacturing method of claim 9, further comprising:
after patterning the first metal layer and the second metal layer to form the first source and the first drain coupled with the first active layer, and the second source and the second drain coupled with the second active layer, depositing a third metal layer on surfaces of the first source, the first drain, the second source, the second drain away from the base substrate and a surface of the second active layer between the first drain and the second source away from the base substrate.

11. The manufacturing method of claim 1, wherein forming the first active layer on the first surface of the base substrate comprises:
forming a first barrier layer on the first surface of the base substrate;
forming a buffer layer on a first surface of the first barrier layer away from the base substrate; and
forming the first active layer on a first surface of the buffer layer away from the base substrate.

12. The manufacturing method of claim 11, wherein forming the first gate on the side of the first active layer away from the base substrate comprises:
forming a first gate insulating layer on a first surface of the first active layer away from the base substrate; and
forming the first gate on a first surface of the gate insulating layer away from the base substrate.

13. The manufacturing method of claim 12, wherein forming the second active layer on the first surface of the base substrate comprises:
forming a second buffer layer on a first surface of the first gate away from the base substrate; and
forming the second active layer on a first surface of the second buffer layer away from the base substrate.

14. The manufacturing method of claim 13, wherein cleaning the exposed first active layer comprises:
cleaning the exposed first active layer by using hydrofluoric acid.

15. The manufacturing method of claim 14, wherein a material of the first active layer comprises low-temperature polysilicon and a material of the second active layer comprises an oxide semiconductor.

16. The manufacturing method of claim 12, wherein forming the second gate on the side of the second active layer away from the base substrate comprises:
 forming a second gate insulating layer on a first surface of the second active layer away from the base substrate; and
 forming the second gate on a first surface of the second gate insulating layer away from the base substrate.

17. The manufacturing method of claim 16, wherein cleaning the exposed first active layer comprises:
 cleaning the exposed first active layer by using hydrofluoric acid.

18. The manufacturing method of claim 17, wherein a material of the first active layer comprises low-temperature polysilicon and a material of the second active layer comprises an oxide semiconductor.

\* \* \* \* \*